US006022799A

United States Patent [19]
Foote et al.

[11] Patent Number: 6,022,799
[45] Date of Patent: Feb. 8, 2000

[54] METHODS FOR MAKING A SEMICONDUCTOR DEVICE WITH IMPROVED HOT CARRIER LIFETIME

[75] Inventors: David K. Foote, Campbell; Minh Van Ngo, Union City; Darin A. Chan, Campbell, all of Calif.

[73] Assignee: Advanced Micro Devices, Inc., Sunnyvale, Calif.

[21] Appl. No.: 08/993,828

[22] Filed: Dec. 18, 1997

Related U.S. Application Data

[63] Continuation-in-part of application No. 08/479,718, Jun. 7, 1995, Pat. No. 5,710,067, and a continuation-in-part of application No. 08/862,599, May 23, 1997, abandoned.

[51] Int. Cl.⁷ .............................................. H01L 21/8247
[52] U.S. Cl. ......................... 438/637; 438/702; 438/740
[58] Field of Search .................................. 438/637, 702, 438/740

[56] References Cited

U.S. PATENT DOCUMENTS

| | | | |
|---|---|---|---|
| 3,422,321 | 1/1969 | Tombs | 317/235 |
| 3,874,919 | 4/1975 | Lehman | 117/212 |
| 4,532,022 | 7/1985 | Takasaki et al. | 204/192 |
| 4,543,707 | 10/1985 | Ito et al. | 29/578 |
| 4,721,631 | 1/1988 | Endo et al. | 427/66 |
| 4,762,728 | 8/1988 | Keyser et al. | 427/38 |
| 4,871,689 | 10/1989 | Bergami et al. | 437/67 |
| 4,988,423 | 1/1991 | Yamamoto et al. | 204/192.17 |
| 5,071,790 | 12/1991 | Kim | 437/195 |
| 5,194,777 | 3/1993 | Nakaya et al. | 313/509 |
| 5,252,515 | 10/1993 | Tsai et al. | 437/195 |
| 5,260,236 | 11/1993 | Petro et al. | 437/241 |
| 5,378,659 | 1/1995 | Roman et al. | 437/229 |
| 5,393,694 | 2/1995 | Mathews | 438/448 |
| 5,578,524 | 11/1996 | Fukase | 437/195 |
| 5,635,423 | 6/1997 | Huang | 437/195 |
| 5,652,172 | 7/1997 | Yung-Sung | 437/60 |
| 5,710,067 | 1/1998 | Foote | 437/238 |
| 5,928,967 | 7/1999 | Radens | 438/740 |
| 5,930,627 | 7/1999 | Zhou | 438/257 |
| 5,940,735 | 8/1999 | Mehta | 438/783 |

OTHER PUBLICATIONS

Wolf, Stanley, Silicon Processing for the VLSI Era vol. 1, p. 169, 1986.

T. Tanaka et al. "A New Photolithography Technique with Antireflective Coating on Resist: ARCOR", J. Electrochem. Soc., vol. 137, No. 12, Dec., 1990, pp. 3900–3905.

T. Ogawa et al., "$SiO_xN_y$:H, high performance anti-reflective layer for current and future optical lithography".

M. Armacost et al., "Selective Oxide: Nitride Dry Etching in a High Density Plasma Reactor," Electrochemical Society Meeting, 1993, Extended Abstract, col. 93–1, p. 369.

T. Gocho et al., "Chemical Vapor Deposition of Anti-Reflective Layer Film for Excimer Laser Lithography", Japanese Journal of Applied Physics, vol. 33, Jan., 1994, Pt. 1, No. 1B, pp. 486–490.

"Use of Oxidized Silicon Nitride as an Etch Step for Plasma Etching", IBM Technical Disclosure Bulletin (Sep., 1980), vol. 23, No. 4, p. 1360. ISSN: 0018–8689.

Wolf, Stanley, "Silicon Processing for the VLSI ERA", vol. 1, Lattice Press; Sunset Beach, California (1986), pp. 427 and 465.

Wolf, Stanley, Silicon Processing for the VLSI ERA, vol. 2, Lattice Press, Sunset Beach, California (1990) pp. 132–133.

Wolf, Stanley, "Silicon Processing for the VLSI ERA", vol. 1, Lattice Press; Sunset Beach, California (1986), pp. 171–174, 183–185, 191–194.

*Primary Examiner*—Charles Bowers
*Assistant Examiner*—Matthew Whipple

[57] ABSTRACT

A local interconnection to a device region in/on a substrate is formed by depositing either silicon oxynitride or silicon oxime as an etch stop layer, at a temperature of less than about 480° C. to increase the hot carrier injection (HCI) lifetime of the resulting semiconductor device. A dielectric layer is then deposited over the etch stop layer and through-holes are etched exposing the etch stop layer using a first etching process. A second etching process is then conducted, which etches through the etch stop layer exposing at least one device region. The resulting through-hole is then filled with conductive material(s) to form a local interconnection.

11 Claims, 4 Drawing Sheets

METHODS FOR MAKING A SEMICONDUCTOR DEVICE WITH IMPROVED HOT CARRIER LIFETIME

RELATED APPLICATIONS

This application is a continuation-in-part of U.S. patent application Ser. No. 08/479,718, filed on Jun. 7, 1995 now U.S. Pat. No. 5,710,067, entitled "Silicon Oxime Film", and a continuation-in-part of U.S. patent application Ser. No. 08/862,599, filed on May 23, 1997 now abondaned, entitled "A Semiconductor Device With Improved Hot Carrier Lifetime And Method For Making The Same Using Silicon Oxynitride At The Local Interconnect Etch Stop Layer". The entire disclosures of U.S. patent application Ser. No. 08/479, 718, and U.S. patent application Ser. No. 08/862,599, are incorporated herein by reference in their entirety.

FIELD OF THE INVENTION

The present invention relates to the manufacture of semiconductor devices, particularly to semiconductor devices exhibiting an improved hat carrier lifetime.

BACKGROUND OF THE INVENTION

As devices have been scaled, the channel length in the semiconductor devices has become smaller and smaller. When the semiconductor devices have a gate size of 0.30 $\mu$m, for example, the extremely short channel length generates a hot carrier effect. For example, as the channel length is made smaller, its associated electric field increases. As the electric field increases, the force on the electrons increases causing them to move faster and faster in the channel. Such energetic electrons are referred to as "hot carriers".

There is a potential barrier between the silicon substrate and the silicon dioxide ($SiO_2$) gate oxide of a metal oxide semiconductor (MOS) transistor. As electrons flow in the channel, some scattering of the electrons in the lattice of the silicon substrate occurs due to interface states and fixed charges (interface defects). As electron scattering increases, the mobility of the hot carriers is reduced, thereby reducing the current flowing through the channel. Over a period of time, hot carriers degrade the silicon bonds with an attendant increase in electron scattering due to an increase in interface and bulk defects. As a result, the transistor slows down over a period of time. The lifetime of the transistor is normally measured as the length of time a device operates until a 10% degradation in the operation of the device is reached. This may be measured, for example, as a 10% reduction in the current flow in the channel. For example, if a transistor designed for a 10 milliamp current in 3.3 volt technology is reduced to less than 9 milliamp within one year, the semiconductor device is said to have a hot carrier lifetime of one year. The hot carrier lifetime constraints in an NMOS device limits the current drive that can be used in a given technology. By improving the hot carrier lifetime, the current drive can be increased, thereby increasing the operating speed of a device, such as a microprocessor.

A conventional method for manufacturing semiconductor devices involves local interconnect technology wherein through-holes are etched through a dielectric layer to the active device regions on a semiconductor substrate. The through-holes are filled with a conductive material for electrical to the device regions. This technique is favored due to the reduction in the number of metallization layers made possible by the local interconnection of the device regions.

In conventional local interconnect methodology, the through-holes are formed by etching through a dielectric material, such as spin on glass (SOG), tetraethylorthosilicate (TEOS) or a high density plasma oxide. The through-holes are etched to eventually expose at least one of the gate electrode, drain and/or source of the transistor. It is critically important for proper functioning operation of the final semiconductor device that such through-hole etching is performed carefully such that the underlying conductive layer or regions, e.g., a metal silicide layer on the upper surface of the gate, drain and/or source, and the gate polysilicon and/or the doped source/drain regions in the substrate. However, the distance of the through-hole between the upper surfaces of the dielectric layer and the gate electrode is shorter than the distance of the through-holes to the source/drain regions to the upper surface of the dielectric layer. When etching through the dielectric layer, the through-hole to the gate is completed well before the through-hole to the source/drain regions. If etching is not controlled, over-etching through the gate electrode would occur before the through-holes are extended to the source/drain regions. A conventional approach to this problem resides in depositing an etch stop layer to halt the through-hole etching upon reaching the gate electrode, allowing the etching of through holes to the source/drain regions to continue.

In the conventional local interconnect process, silicon nitride ($Si_3N_4$) is the preferred etch stop layer when etching through an overlying oxide layer, due to its excellent etch selectivity with respect to silicon dioxide and to the metal silicide layers forming contacts to the gate electrode and source/drain regions. Once the first etching process is completed, so that the through-holes extend to the silicon nitride etch stop layer, a second etching technique is performed to etch through the silicon nitride etch stop layer to the metal silicide contact layers on the gate electrode, and source/drain regions.

Semiconductor devices produced by such conventional local interconnect methodology have relatively short hot carrier lifetimes. After experimentation and investigation, it was found that the use of the silicon nitride as the etch stop layer in the conventional local interconnect method reduces the lifetime of the device. The exact mechanism involved such lifetime lowering is not known. However, it is believed that the silicon nitride etch stop layer somehow degrades the silicon dioxide/silicon substrate interface, thereby lowering the lifetime of the resulting semiconductor device.

SUMMARY OF THE INVENTION

There is a need for an improved local interconnect method which yields semiconductor devices having longer lifetimes, without an attendant significant increase in the complexity or expense.

This and other needs are met by an aspect of the present invention which enables the manufacture of a semiconductor device having a high hot carrier lifetime employing a damascene local interconnect process. In an embodiment of the present invention, the conventional silicon nitride (e.g., $Si_3N_4$) is replaced with an etch stop comprising silicon oxynitride ($SiO_xN_y$, wherein x and y represent the atomic percentage of oxygen and nitrogen, respectively) or silicon oxime (e.g., $Si_{1-(x+y+z)}N_xO_y:H_z$, wherein x, y and z represent the atomic percentage of nitrogen, oxygen and hydrogen, respectively), deposited at a temperature less than about 480° C. The inventive method is otherwise consistent with conventional local interconnect methodology except for the use of silicon oxynitride or silicon oxime as the etch stop layer over the gate, drain and source contacts of the device regions. A dielectric layer is deposited over the silicon oxynitride or silicon oxime layer and through-holes are etched through the dielectric layer to the silicon oxynitride or silicon oxime layer by a first etching process. The silicon oxynitride or silicon oxime Slayer serves as the etch stop during the first etching process. Etching of the through-holes through the silicon oxynitride or silicon oxime layer to the gate, drain and source contacts is then performed by a second etching process. The through-holes formed in the dielectric layer are then filled with conductive material, e.g., tungsten, in a conventional manner to provide a local interconnection to the device regions.

Silicon oxynitride and silicon oxime have not been used in the prior art local interconnect processes, because silicon nitride tends to have a higher etch selectivity than either of these dielectric materials. However, it was found that the etch selectivity of the silicon oxynitride and the silicon oxime with respect to the dielectric oxide is sufficiently high to be acceptable for use in the local interconnect process. It was unexpectedly found that the use of silicon oxynitride or silicon oxime as an etch stop layer in accordance with the present invention dramatically extends the device lifetime vis-à-vis devices formed using silicon nitride in the local interconnect method as the etch stop layer.

For example, laboratory testing revealed that semiconductor devices formed according to the local interconnect process, employing silicon oxynitride and/or silicon oxime as the etch stop layer in accordance with an embodiment of the present invention, have a device lifetime in excess of ten times that of devices made by the conventional local interconnect process employing silicon nitride as the etch stop layer. Further, in accordance with yet another aspect of the present invention, by depositing the etch stop layer at a relatively low temperature, for example, below about 480° C., the hot carrier lifetime is further increased.

The foregoing and other features, aspects and advantages of the present invention will become more apparent from the following detailed description of the present invention when taken in conjunction with the accompanying drawings.

DETAILED DESCRIPTION OF ILLUSTRATIVE EMBODIMENTS

Figure 1:
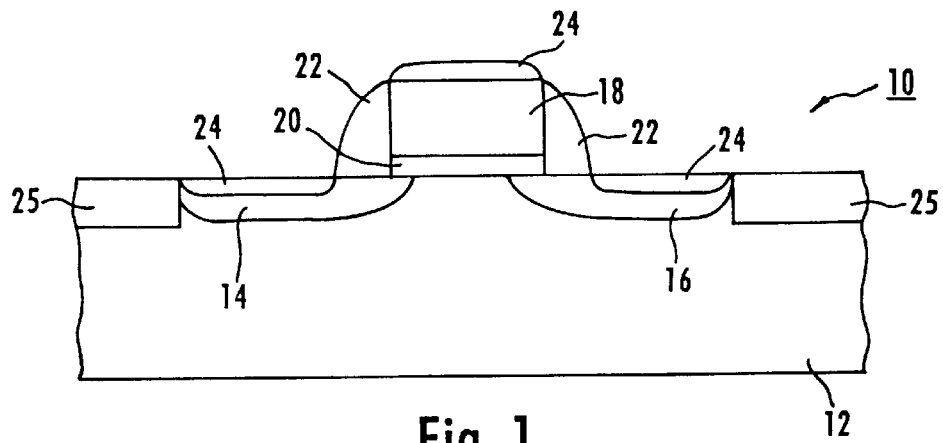
FIGS. 1 through 6 schematically illustrate sequential stages of a method in accordance with an embodiment of the present invention.

The present invention provides a method of improving the lifetime of a semiconductor device comprising a local interconnect. In FIG. 1, a cross-section of a transistor 10, which has been formed according to conventional techniques, is depicted. The transistor 10 is an n-channel metal oxide semiconductor (NMOS) device in the exemplary illustrated embodiment. Accordingly, the substrate 12 is a p-type substrate. A source region 14 and a drain region 16 are formed through doping to produce n+ doped areas.

A doped polysilicon gate 18 is provided on a gate oxide layer 20, typically a silicon dioxide ($SiO_2$) layer. Degradation of the interface between the silicon substrate 12 and the silicon dioxide gate oxide layer 20 would lead to the shortening of the lifetime of the transistor 10. Sidewall spacers 22 are provided on the sidewalls of the gate 18 and serve to isolate the gate 18 from the source/drain 14, 16.

Layers of metal silicide 24 are provided on the gate 18, source 14 and drain 16. The metal silicide 24 may be titanium metal silicide, for example. In the local interconnect process, the conductive material forms electrical contacts to the metal silicide 24, and hence the transistor 10. Isolation areas 25 isolate the transistor 10 from other devices on the chip. The transistor 10 depicted in FIG. 1 may be formed in accordance with conventional semiconductor methodology.

Figure 2:
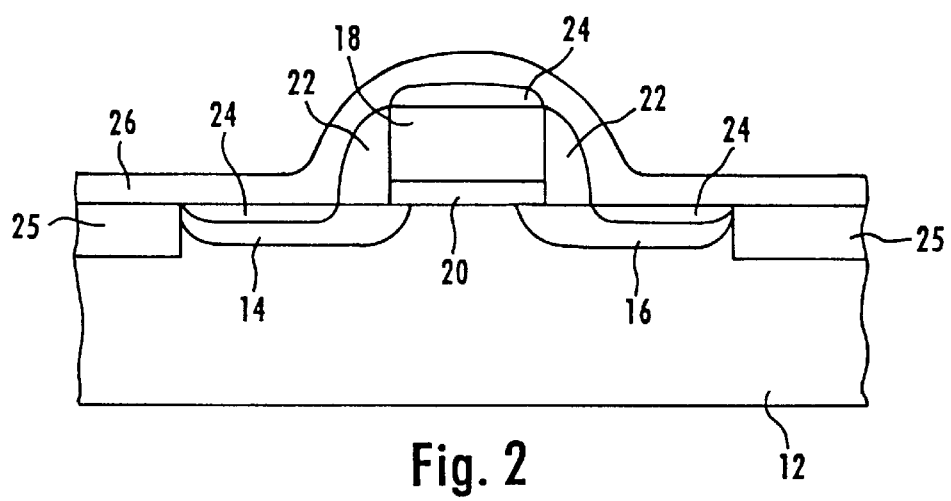

FIG. 2 depicts the transistor of FIG. 1 following deposition of an etch stop layer 26 in the first step of the local interconnect process. In conventional local interconnect processes, the etch stop layer is silicon nitride, which is typically selected due to its excellent etch selectivity with respect to the dielectric oxide and the metal silicide. In the present invention, however, a silicon oxynitride or a silicon oxime is used instead of silicon nitride as the etch stop layer 26.

Conventional wisdom holds that, the HCI lifetime and the data retention capabilities of a semiconductor device having a silicon nitride etch stop layer are each improved by depositing the silicon nitride layer at a relatively high temperature, for example, at least 480° C. It is conventionally believed that the higher deposition temperature for silicon nitride reduces the concentration of hydrogen in the etch stop layer, which can act as hot carriers that reduce the HCI lifetime and data retention. Contrary to such conventional processes and theories, it has been found that reduction of the deposition temperature of a silicon-rich etch stop layer, e.g., silicon oxynitride or silicon oxime, actually and significantly increases the HCI lifetime. This finding indicates that increasing the concentration of hydrogen in such an etch stop layer improves the HCI lifetime of the semiconductor device.

In practicing the embodiments of the present invention, silicon oxynitride and silicon oxime can be deposited employing conventional deposition techniques, and hence, such conventional deposition techniques are not set forth herein in great detail. In accordance with certain embodiments of the present invention, the silicon oxynitride is deposited at a deposition temperature less than about 480° C., e.g., about 275° C. to about 475° C., preferably about 350° C. to about 450° C.

Silicon oxime differs structurally from conventional silicon oxynitride material in that the silicon atoms are bonded directly to the nitrogen atoms, while the oxygen atoms are bonded to the nitrogen atoms. As used herein, silicon oxime, which contains essentially no bonding between silicon and oxygen atoms, is characterized by the formula $Si_{(1-x+y+z)}N_xO_y:H_z$. wherein x, y and z represent the atomic percentage of nitrogen, oxygen and hydrogen, respectively.

It has also been found that the silicon oxime employed in accordance with the present invention is resistant to dry plasma etches which would normally etch silicon oxide. This advantageous etch characteristic renders silicon oxime particularly suitable for use as the etch stop layer in accordance with certain embodiments of the present invention. Silicon oxime can be produced by reacting source gases for the components, i.e., silicon, nitrogen, oxygen and hydrogen, under dynamic conditions employing a stoichiometric excess amount of nitrogen, sufficient to substantially prevent oxygen atoms from reacting with silicon atoms. The stoichiometric excess amount of nitrogen can be easily determined in a particular situation. Preferably, the amount of nitrogen is at least ten times the amount of oxygen present during reaction. In forming silicon nitride by plasma enhanced chemical vapor deposition (PECVD), it is preferred to conduct the deposition under steady state conditions in a nitrogen-rich atmosphere.

In a preferred embodiment of the present invention, silicon oxime is formed by reactive deposition under dynamic conditions employing a conventional PECVD reactor, such as that typically employed to deposit silicon oxynitride. However, the conditions under which the reaction is conducted differ from the conditions conventionally employed to deposit silicon oxynitride. Typically, silicon oxynitride is deposited under equilibrium conditions in a PECVD reactor. However, in accordance with the present invention, silicon oxime is produced during the non-equilibrium conditions that exist at the on-set of a glow discharge in the PECVD reactor, employing a stoichiometric excess amount of nitrogen to substantially prevent bonding between silicon and oxygen atoms. In a preferred aspect of this embodiment, reactive deposition of silicon oxime in a PECVD reactor is conducted in a nitrogen atmosphere to effectively preclude bonding of silicon and oxygen atoms. The temperature employed for the reaction can range from about 275° C. to about 475° C., preferably about 350° C. to about 450° C. The pressure employed during the deposition reaction can range from about 1 to about 10 Torr, preferably about 2 to about 3 Torr.

Figure 3:
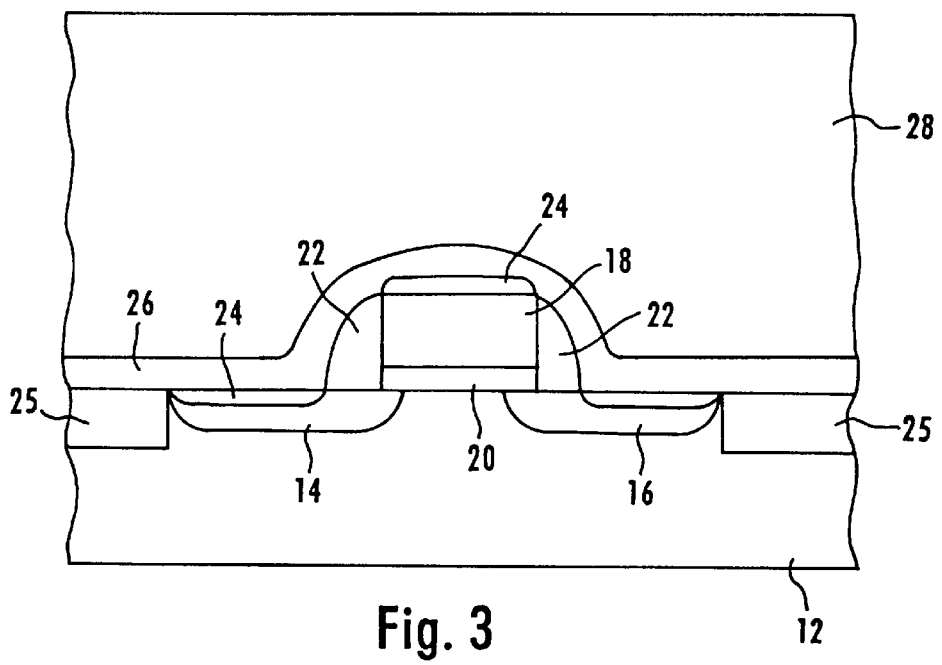

Averting to FIG. 3, after etch stop layer 26 is deposited over the transistor 10, dielectric oxide 28 is deposited over the etch stop layer 26. Dielectric oxide 28 may comprise any of a number of different types of dielectric materials, e.g., SOG, TEOS, or high density plasma oxide (HDP). The thickness of the etch stop layer can be optimized in a particular application. For example, it was found that an etch stop layer having a thickness of about 500 Å to about 1,000 Å effectively achieves the objectives of the present invention.

Figure 4:
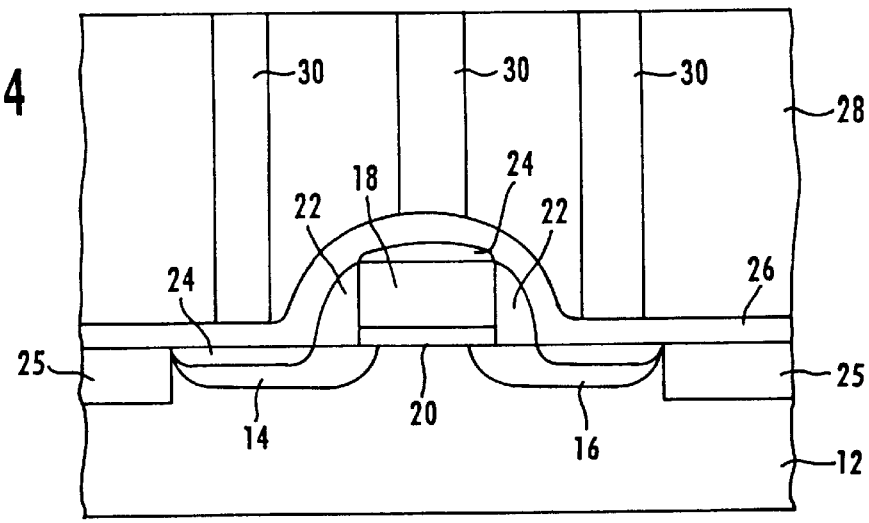

FIG. 4 depicts the structure of FIG. 3, after a first etching process has been performed. The first etching typically comprises anisotropic etching and creates through-holes 30 over the metal silicide on top of the gate, source and drain. For illustrative convenience, the masking and patterning steps prior to the etching have not been depicted.

The first etching is highly selective such that dielectric oxide 28 is etched at a much faster rate than etch stop layer 26. Thus, etch stop layer 26, since it is substantially conformal, substantially prevents further etching of the through-hole 30 into the metal silicide layer 24 on top of the gate 18, while allowing etching of the through-holes 30 over the source 14 and drain 16 to continue until the etch stop layer 26 is reached.

Figure 5:
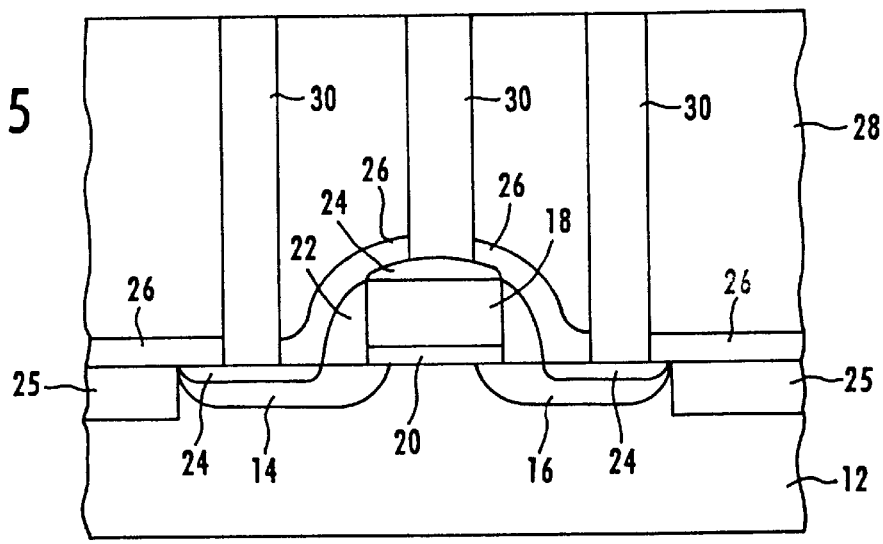
Figure 6:
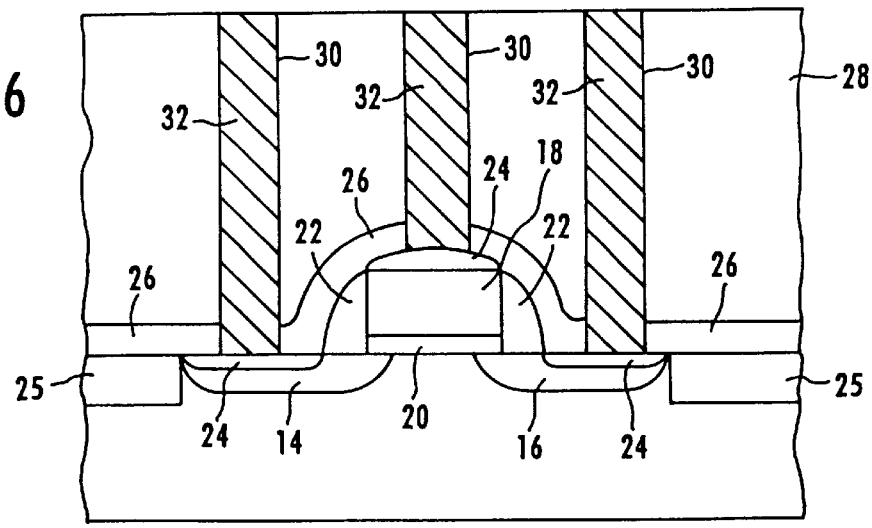

After etching through-holes 30 to reach the etch stop layer 26, a second etching is performed. In preferred embodiments, this second etching is also an anisotropic etching, such as reactive ion etch (RIE). However, in this second etching, the etch stop layer is etched at a much faster rate than the underlying metal silicide over the gate, source and drain. Thus, as shown in FIG. 5, after the second etching, the through-holes 30 extend through etch stop layer 26 to reach metal silicide 24 over gate 18, source 14 and drain 16.

After etching through-holes 30 through the dielectric 28 to metal silicide 24, conductive material 32 is deposited in the through-holes 30 to form conductive contacts, which provide a conductive path and interconnection of the transistor from the gate 18, source 14 and drain 16 to other components/regions on the semiconductor chip. In certain preferred embodiments, for example, the conductive material 32 includes tungsten (W), which is deposited in the through-holes 30 following the formation of a thin barrier or adhesion promoting layer of titanium—titanium nitride (tie-in).

Figure 7:
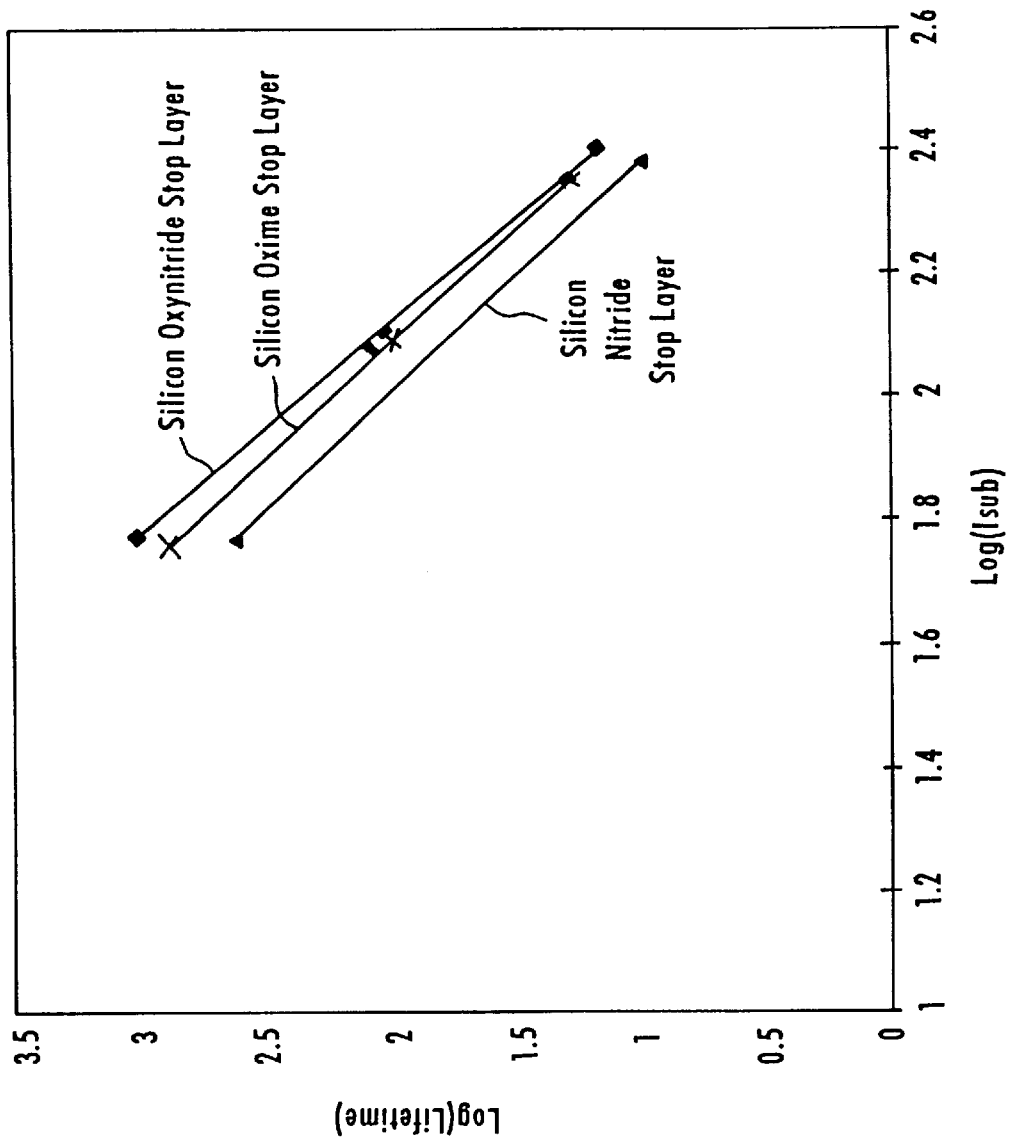
FIG. 7 is a graph depicting a portion of the lifetime in hours of a semiconductor device formed with a local interconnect process according to the present invention compared to devices formed in accordance with the prior art, plotted against the substrate current.

The inventive local interconnection methodology yields semiconductor devices exhibiting unexpected and significantly greater lifetimes in comparison to devices produced using conventional local interconnect technology. A chart detailing the results of experiments is shown in FIG. 7, in which the log of the lifetime of the devices is plotted against the log of the substrate current (Isub). As can be seen from such experimental data, for a given substrate current, the lifetime of devices prepared employing the local interconnect methodology of the present invention, as represented by the upper two lines in the chart, unexpectedly have a lifetime of approximately 10 times greater than the lifetimes of devices prepared employing conventional local interconnect methodologies producing a silicon nitride etch stop layer, as depicted by the lowest line.

Figure 8:
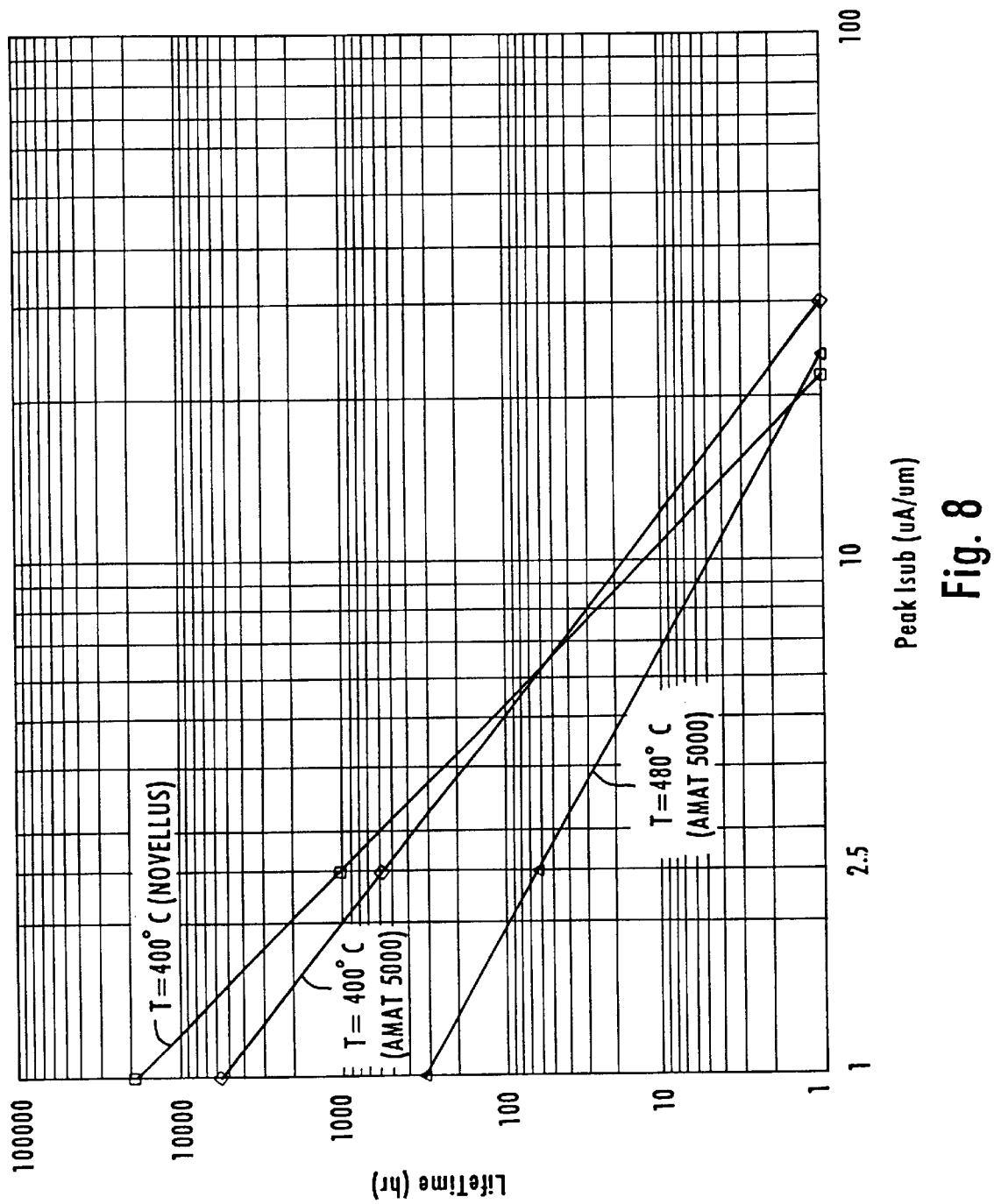
FIG. 8 is a graph depicting a portion of the lifetime in hours of three similar semiconductor devices formed with a local interconnect process using different etch stop layer temperatures, according to the present invention, plotted against the substrate current.

Further, an exemplary chart detailing the results of experiments investigating the effects of different deposition temperatures in the formation of a silicon oxynitride etch stop layer is shown in FIG. 8, in which the log of the lifetime of the devices is plotted against the log of the substrate current (Isub). As can be seen from such experimental data, for a given substrate current, the lifetime of devices prepared using the lower temperature local interconnect process of the present invention, as represented by the upper two lines in the chart (deposition temperature of about 400° C.), have a lifetime of approximately 10 times or greater than the lifetimes of devices prepared using a higher deposition temperature of about 480° C., as depicted by the lowest line.

The present invention can be employed in the manufacture of any various types of semiconductor devices having local interconnects. The present invention is cost effective, efficient, and can easily be integrated into conventional production lines.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method of manufacturing a semiconductor device having a local interconnect to a device region, the method comprising:

depositing an etch stop layer comprising silicon oxynitride ($SiO_xN_y$), by low pressure chemical vapor deposition at a temperature less than about 480° C., over at least a portion of a device region;

depositing a dielectric layer over the etch stop layer;

etching through-holes in the dielectric layer using a first etching process and stopping on the etch stop layer;

etching through the etch stop layer, using a second etching process, to expose at least a portion of the device region; and filling the through-holes with conductive material to provide the local interconnect to the device region.

2. The method of claim 1, comprising depositing the etch stop layer at a temperature between about 275° C. to about 475° C.

3. The method of claim 1, comprising depositing the etch stop layer at a temperature between about 350° C. to about 450° C.

4. The method of claim 1, wherein the etch stop layer has a thickness of about 500 Å to about 1,000 Å.

5. The method of claim 1, wherein the first etching and the second etching of the through-holes are anisotropic etches.

6. The method of claim 1, wherein the first and second etching processes comprise anisotropic etching.

7. A method of manufacturing a semiconductor device having a local interconnect to a device region, the method comprising:

depositing an etch stop layer comprising silicon oxime ($Si_{(1-x+y+z)}N_xO_y:H_z$), by low pressure chemical vapor deposition at a temperature less than about 480° C., over at least a portion of a device region;

depositing a dielectric layer over the etch stop layer;

etching through-holes in the dielectric layer using a first etching process and stopping on the etch stop layer;

etching through the etch stop layer, using a second etching process, to expose at least a portion of the device region; and filling the through-holes with conductive material to provide the local interconnect to the device region.

8. The method of claim 7, comprising depositing the etch stop layer at a temperature between about 275° C. to about 475° C.

9. The method of claim 7, comprising depositing the etch stop layer at a temperature between about 350° C. to approximately 450° C.

10. The method of claim 7, wherein the etch stop layer has a thickness of about 500 Å to about 1,000 Å.

11. The method of claim 7, wherein the first and second etching processes comprise anisotropic etching.

* * * * *